(12) United States Patent
Erratico

(10) Patent No.: US 6,828,651 B2
(45) Date of Patent: Dec. 7, 2004

(54) INTEGRATED STRUCTURE

(75) Inventor: Pietro Erratico, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/899,573

(22) Filed: Jul. 5, 2001

(65) Prior Publication Data

US 2002/0014678 A1 Feb. 7, 2002

(30) Foreign Application Priority Data

Jul. 14, 2000 (EP) .......................................... 00830492

(51) Int. Cl.⁷ .............................................. H01L 29/00
(52) U.S. Cl. .................... 257/520; 257/499; 257/510; 257/513; 257/517
(58) Field of Search ................................ 257/499, 506, 257/509, 510, 520, 504, 329, 330, 370, 332, 513, 517

(56) References Cited

U.S. PATENT DOCUMENTS

| | | | |
|---|---|---|---|
| 4,416,050 A | | 11/1983 | Sarace .......................... 29/571 |
| 4,631,803 A | * | 12/1986 | Hunter et al. ................. 29/576 |
| 5,034,785 A | * | 7/1991 | Blanchard .................. 357/23.4 |
| 5,476,809 A | | 12/1995 | Kobayashi ................... 437/62 |
| 5,597,742 A | | 1/1997 | Zambrano .................... 437/31 |
| 5,736,445 A | * | 4/1998 | Pfirsch ......................... 438/275 |
| 5,757,081 A | * | 5/1998 | Chang et al. ................ 257/778 |
| 5,990,537 A | * | 11/1999 | Endo et al. .................. 257/529 |
| 5,998,822 A | * | 12/1999 | Wada .......................... 257/301 |
| 6,175,277 B1 | * | 1/2001 | Mavencamp ................ 330/264 |
| 6,184,565 B1 | * | 2/2001 | Beasom ....................... 257/487 |
| 6,184,566 B1 | * | 2/2001 | Gardner et al. ............. 257/510 |
| 6,239,465 B1 | * | 5/2001 | Nakagawa .................. 257/331 |
| 6,452,230 B1 | * | 9/2002 | Boden, Jr. ................... 257/341 |

FOREIGN PATENT DOCUMENTS

| | | | |
|---|---|---|---|
| EP | 0292972 | 11/1988 | .......... H01L/21/76 |
| EP | 0429131 | 5/1991 | .......... H01L/27/02 |
| EP | 0566186 | 10/1993 | .......... H01L/27/02 |
| JP | 63-293938 | 11/1988 | .......... H01L/21/76 |

OTHER PUBLICATIONS

Baliga, B. Jayant, "Modern Power Devices", reprint edition 1992 published by Krieger Publ. Co., Malabar, Florida 1992 (ISBN 0–89464–799–7), p. 377.*

T. Yamaguchi et al., "Prcoess and Device Performance of Submicrometer–Channel CMOS Devices Using Deep–Trench Isolation and Self–Aligned TiSi2 Technologies", IEEE Journal of Solid–State Circuits, vol. sc–20, No. 1, Feb. 1985.*

* cited by examiner

*Primary Examiner*—Nathan J. Flynn
*Assistant Examiner*—Johannes Mondt
(74) *Attorney, Agent, or Firm*—Lisa K. Jorgenson; Allen, Dyer, Doppelt, Milbrath & Gilchrist, P.A.

(57) ABSTRACT

An integrated structure formed on a semiconductor chip includes a substrate having a first conductivity type and an epitaxial layer grown on the substrate. The epitaxial layer may have the first conductivity type and also a conductivity less than a conductivity of the substrate. Moreover, the integrated structure may include a first region and a second region in the epitaxial layer, each having a conductivity type opposite that of the epitaxial layer. The first and second regions may extend from a surface of the epitaxial layer opposite the substrate into the epitaxial layer to form respective first and second junctions therewith. Further, the integrated structure may also include an isolating element for reducing an injection of current through the epitaxial layer from the first region to the second region when the first junction is directly biased.

8 Claims, 4 Drawing Sheets

INTEGRATED STRUCTURE

FIELD OF THE INVENTION

The present invention relates to the field of electronic circuits, and, more particularly, to integrated structures formed on semiconductor chips.

BACKGROUND OF THE INVENTION

Integrated structures are often formed in semiconductor chips and include a substrate which has a high concentration of impurities, i.e., with doping of the P+ type (or N+ type). Further, an epitaxial layer may be included which has a conductivity of the same type as that of the substrate, but a low concentration of impurities, i.e., with doping of the P- type (or N- type). These structures are commonly called "P+P-" (or N+N-) structures. The epitaxial layer also has suitably doped regions formed therein, inside of which electronic components or circuit groups are formed.

One known technology for power applications is bipolar-CMOS-DMOS (BCD) technology. BCD technology allows for the integration of several output power devices, which is particularly advantageous when it is necessary to construct half-bridge or whole-bridge circuits both of the single-phase and three-phase type, or when a large number of parallel outputs are required. The need to have several isolated outputs in certain applications results in the use of a substrate having a polarity different from that of a collector of a bipolar transistor, or from that of a drain of a metal oxide semiconductor (MOS) transistor, which are integrated in the epitaxial layer.

Consequently, in BCD technology, the integrated components include terminals which, for isolation, are located on the surface of the semiconductor chip. In particular, in the context of BCD technology and for power applications where relatively low supply voltages are required (i.e., typically, but not exclusively, ranging between 30 V and 60 V), P+P- structures are typically used. In such cases, the P+P- structures have a relatively small epitaxial layer thickness of between 5 $\mu$m and 7 $\mu$m, for example.

In general, the electronic components or the circuit groups formed in a structure integrated in a semiconductor chip must be electrically isolated from each other. One widely used isolating technique includes creating isolating regions inside the semiconductor chip which have a conductivity of the type opposite to that of the semiconductor material. These isolating regions are biased with respect to the semiconductor material so that the PN junctions which they form with the material are reverse-biased. The reverse-biasing of these regions, which include various components or circuit groups, ensures that they are isolated under normal operating conditions.

Undesired current may flow in integrated structures including two or more isolating regions or other regions with a conductivity of the type opposite to that of the semiconductor material inside which they are formed. The undesired current may cause abnormal operation of the integrated structure to occur. These currents are caused by transient direct biasing of the junctions which, during normal operation, are reverse-biased.

For example, in the case of power applications of the integrated structure, this direct biasing may occur upon switching of polarity in inductive loads, such as inductances or motors, or in capacitive loads, such as capacitors, batteries and accumulators. Moreover, the current generated by injection of charges from a region directly biased with respect to the semiconductor material in which it is formed may reach a further region similar to the directly biased region, but that is reverse-biased.

In this situation a lateral parasitic bipolar transistor is formed. The two homologous regions forming the emitter and the collector and the intermediate semiconductor material form the base thereof. It is noted here that the formation of parasitic transistors is a particularly serious problem for technologies such as BCD technology and complementary MOS (CMOS) technology, where several components each with an output designed to assume a different potential are formed on a single integrated circuit. Generally, this phenomena is also known by the term "latch-up".

Various techniques aimed at reducing the effects of formation of these lateral parasitic transistors are known. According to a first technique, the two homologous regions are suitably spaced to reduce the gain of the parasitic transistor. This technique involves a considerable reduction in the area of the integrated structure which can be used for other circuit components.

According to another technique, the portion of semiconductor material located between the two homologous regions, i.e., the base of the parasitic transistor, is more heavily doped to reduce the gain of this transistor. This technique has the disadvantage that, in power applications, a strong electrical field may be created. To reduce the effect of this electrical field, it is necessary to form a suitable termination structure for the homologous regions, which results in considerable waste of the chip area.

According to a further technique, an additional region having a conductivity opposite to that of the epitaxial layer is formed in the epitaxial layer and between the homologous regions. This additional region allows division of the parasitic component between the homologous regions in two lateral parasitic transistors having a common base, formed by the substrate.

This intermediate region is electrically connected to the epitaxial layer by a superficial metal contact strip. This reduces locally the substrate potential, preventing bias conditions and current injection from occurring. This technique requires a suitable termination structure, which also results in a considerable amount of space being used. Moreover, in the case of P+P- structures, it does not guarantee significant results since these structures, owing to the fact that the P+ substrate has a high conductivity and a low value resistance to ground. This makes it difficult to achieve the desired reduction in the substrate potential.

SUMMARY OF THE INVENTION

An object of the present invention is to provide a semiconductor device and related methods which overcome the above mentioned drawbacks of the prior art and that are effective and relatively easy to apply.

This and other objects, features, and advantages of the present invention are provided by an integrated structure formed on a semiconductor chip and including a substrate having a first type of conductivity, and an epitaxial layer grown on the substrate and also having the first conductivity type. The epitaxial layer may have a conductivity which is less than the conductivity of the substrate. Further, first and a second regions may be included in the epitaxial layer having a conductivity opposite to that of the epitaxial layer. The first and second regions may extend from a surface of the epitaxial layer opposite the substrate into the epitaxial layer to form first and second junctions therewith.

The integrated structure may also include a means for reducing an injection of current through the epitaxial layer from the first to the second region when the first junction is directly biased. The means may include an isolating element located between the first and second region that extends from the surface of the epitaxial layer at least as far as the substrate.

A method for producing an integrated structure according to the invention is also provided.

BRIEF DESCRIPTION OF THE DRAWINGS

Further characteristic features and advantages of the present invention will become apparent from the following description of preferred embodiments, given by way of non-limiting examples, with reference to the accompanying figures, in which.

DETAILED DESCRIPTION OF THE PREFERRED EMBODIMENTS

Figure 1:
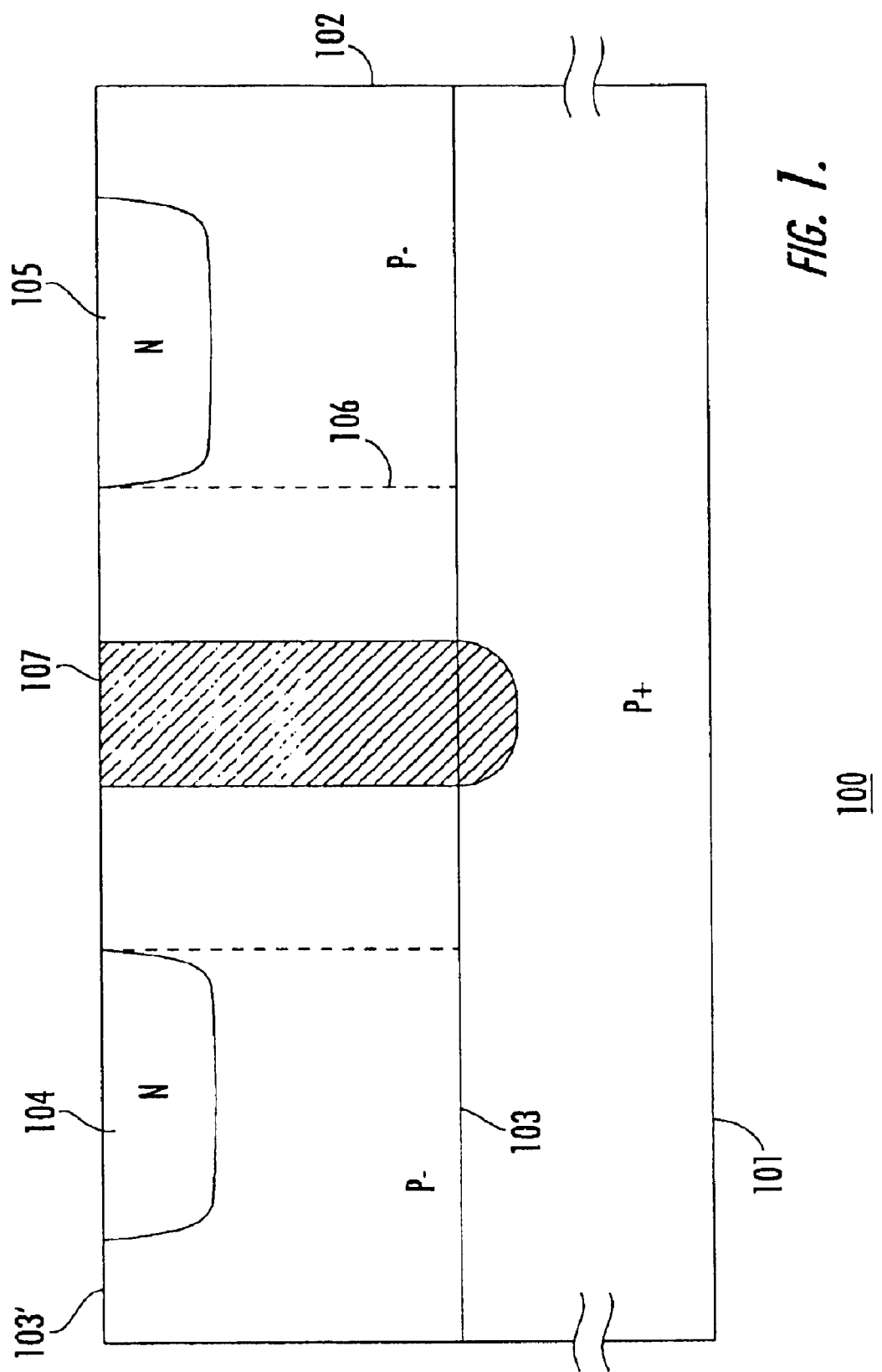
FIG. 1 is a cross-sectional view of a first embodiment of an integrated structure according to the invention.

Turning now to FIG. 1, a first embodiment of the integrated structure 100 according to the invention is schematically shown. The type of doping (P or N) to which the present description refers is exemplary, and the person skilled in the art may easily adapt the teachings of the present invention to structures using doping with signs opposite to those indicated.

The integrated structure 100 includes a substrate 101 of the P type, in particular of the P+ type, and an epitaxial layer 102 which is grown above a boundary surface 103 of the substrate. The epitaxial layer 102 has a conductivity which is of the same type as that of the substrate 101, but has a smaller concentration of impurities. In particular, the epitaxial layer 102 is of the P– type.

For example, the substrate 101 of the P+ type is doped with impurities to have a resistivity of between about 1 mΩ-cm and 100 mΩ-cm. Preferably, this conductivity ranges between 8 mΩ-cm and 12 mΩ-cm. The epitaxial layer 102 of the P– type is doped with impurities to have, for example, a resistivity of between about 5 mΩ-cm and 15 mΩ-cm. Preferably, this resistivity is between about 8 mΩ-cm and 15 mΩ-cm.

Moreover, the substrate 101, for example, has a thickness of between about 500–600 μm, and the epitaxial layer 102 has a thickness of between about 5–15 μm. Preferably, the epitaxial layer 102 has a thickness 102 of between about 5–7 μm. The epitaxial layer 102 has formed therein a region 104 of the N type, and a region 105 of the N type. These regions extend from a surface 103' of the epitaxial layer 102, opposite the surface 103 of the substrate, into the epitaxial layer 102.

The integrated structure 100 may be advantageously used in the context of BCD technology or in the context of CMOS technology. In particular, the region 104 may be a base region of a bipolar transistor having the substrate 101 as the collector region, and the region 105 may form the drain region of a double diffused MOS (DMOS) transistor.

The region 104 and the region 105 are separated by an interface region 106 forming part of the epitaxial layer 102. The region 104 and the region 105 each form a PN junction with the epitaxial layer 102. During normal operating conditions, the two junctions are reverse-biased.

It should be noted that, in particular operating conditions, the PN junction and the interface layer 106 may produce an NPN parasitic lateral transistor. For example, the region 105 is suitable, if biased directly with respect to the epitaxial layer 102, for injecting electrons into this epitaxial layer. In other words, the PN junction formed by the region 105 and by the epitaxial layer 102 forms an emitter/base junction of a lateral parasitic transistor. The region 104, if reverse-biased with respect to the epitaxial layer, acts as a collector of this lateral parasitic transistor.

The interface region 106 includes an isolating element 107 which is located between the region 104 and the region 105. The interface region 106 extends from the surface 103' of the epitaxial layer 102 at least as far as the boundary surface 103 of the substrate 101. In particular, in FIG. 1 the isolating element 107 extends partially inside the substrate 101. The isolating element 107 allows the possibility of parasitic transistors being formed by the above mentioned sequence of differently doped regions, following particular bias conditions, to be reduced or eliminated.

During normal operation of the structure 100, the PN junctions between the regions 104 and 105 and the epitaxial layer 102 are reverse-biased, substantially ensuring isolation between the two regions. In a transient or abnormal bias situation, the region 105 may be at a negative potential with respect to that of the epitaxial layer 102 with the consequent injection of electrons into this layer. The isolating element 107, owing to its isolating function, prevents the conduction of these electrons from the region 105 to the region 104 through the epitaxial layer 102. In this way, the possibility of forming a lateral parasitic transistor in the structure 100 is substantially eliminated.

The electrons injected from the region 105 could reach the region 104 only by "bypassing" the isolating element 107 and passing through the substrate 101. It should be noted that a parasitic transistor of this type, i.e., having the substrate 101 as a base region, has a very low or substantially zero gain. The substrate 101, which is of the P+ type, has a high doping level and renders ineffective a transistor which includes a portion of the substrate in its base.

The parasitic transistors which are effective enough to cause operational disturbances of the integrated structure are those which have the base region immersed in the epitaxial layer 102, and which have a concentration of impurities less than that of the substrate. The isolating element 107, which extends substantially over the whole thickness of the epitaxial layer and potentially partially into the substrate, reduces the flow of current in the epitaxial layer and reduces the formation of the parasitic transistors.

It should be noted, moreover, that an isolating element with a thickness considerably less than the thickness of the epitaxial layer defines a conductive channel. This conductive channel is included in the epitaxial layer itself and allows the electrons injected from the region 105 to reach the region 104, resulting in a parasitic transistor.

According to a preferred embodiment of the invention, the isolating element 107 includes an isolating trench which extends from the surface 103' and passes through the whole thickness of the epitaxial layer 102 as far as the boundary surface 103. Moreover, the trench 107 has oxidized walls and is filled with polysilicon (i.e., polycrystalline silicon). The trench may also extend, partially, into the substrate 101.

Figure 2A:
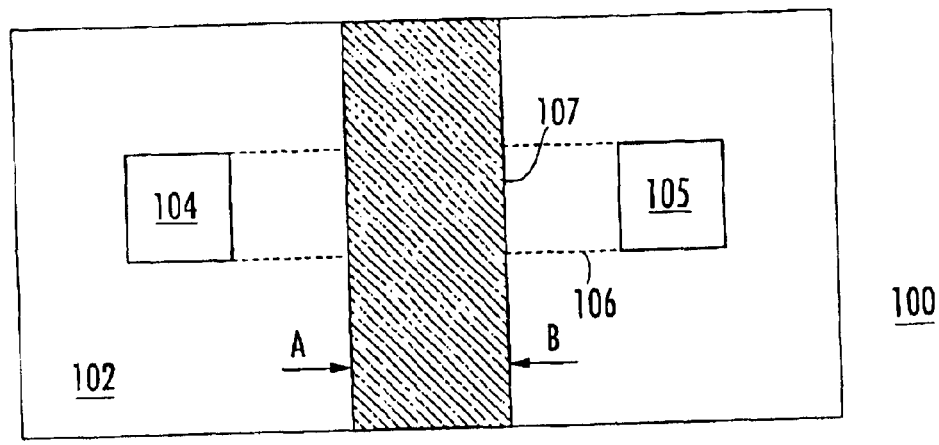
FIG. 2a is a plan view of the first embodiment of FIG. 1.

A plan view of the integrated structure 100 may been seen in FIG. 2a. In the embodiment illustrated in FIG. 2a, the isolating element 107 is located between the region 104 and the region 105 and extends over a length substantially equal to the width of the integrated circuit board 100. This divides the epitaxial layer 102 into two portions including, respectively, the region 104 and the region 105.

Figure 2B:
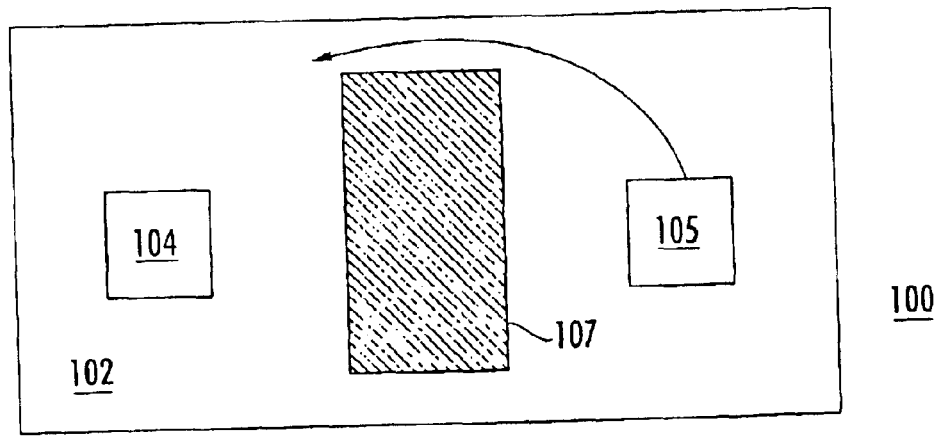
FIG. 2b is a plan view of the second embodiment of the invention.

It should be noted that an effective reduction in the possibility of formation of parasitic transistors may also be obtained with an isolating element having a length less than the width of the integrated circuit board 100, as shown in FIG. 2b. Such an isolating element 107 nevertheless has dimensions that render ineffective (i.e., provide with negligible gain) the lateral parasitic transistor. This includes as a base a section of the epitaxial layer 102 which extends along the sides of the said isolating element 107, i.e., corresponding to a path for the electrons of the type indicated by an arrow in FIG. 2b.

Preferably, the isolating element 107 is formed at a distance from the two regions 104 and 105 to position it outside of the two drain regions associated with the two PN junctions which, under normal conditions, are reverse-biased. In this way, this isolating element is prevented from being subject to intense electrical fields which could cause damage thereto. Moreover, with reference to FIGS. 2a and 2b, it should be noted that each of the two portions into which the epitaxial layer 102 is divided on account of the isolating element 107 may include several integrated circuit components, for example. Each of the integrated circuit components may correspond respectively to a section for processing the signal and a power section.

Figure 2C:
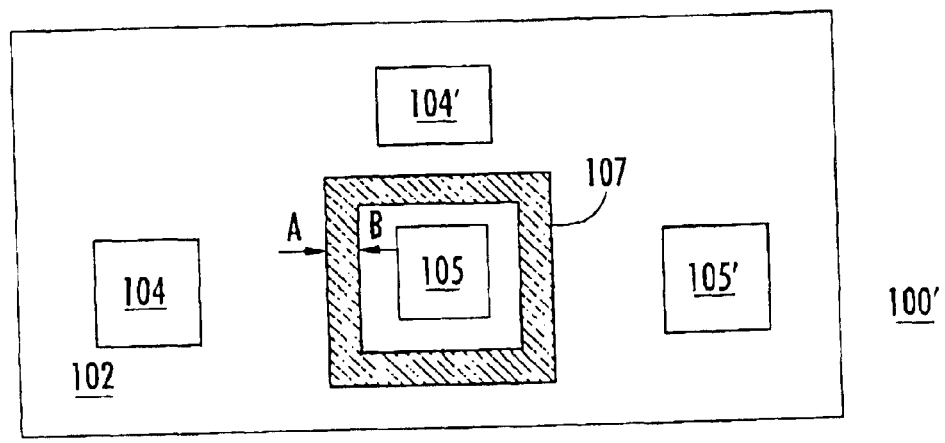
FIG. 2c is a plan view of a third embodiment of the invention.

An integrated structure on a chip 1001 is illustratively shown in FIG. 2c shows and includes, in addition to the isolating regions 104 and 105, an isolating region 104' and an isolating region 105'. Both the isolating region 104' and the isolating region 105' are of the N type and relate to further circuit components (e.g., DMOS, CMOS transistors). Advantageously, as shown in FIG. 2c, the isolating element 107 may be formed to surround the region 105 on all lateral sides. In this way, both the possibility of lateral parasitic transistors being formed with the region 104, as well as the formation of these transistors with the regions of the N type 104' and 105' present on the chip 100', are avoided.

This result is particularly advantageous for integrated circuits formed in the context of BCD technology, where the same chip may include integrated circuit components having drain or collector terminals designed to assume different electric potentials. For example, these circuit components may form a conventional bridge structure for supplying inductive loads. The isolating element 107 may surround that region of the N type which is capable, because of the particular circuital application of the component associated therewith, of injecting electrons into the epitaxial layer 102. Nevertheless, this isolating element may be formed to surround those regions suitable for forming the collector of a possible parasitic transistor. Moreover, the isolating element 107 may be formed to surround only partially a given isolating region, but in any case to render ineffective the lateral parasitic transistors which could be created.

The appropriate length of the isolating element 107, i.e., the value of the dimension A-B in FIGS. 2a and 2c, may be easily determined by the person skilled in the art based upon the present description and the particular application for which the integrated structure 100 is to be used. Of course, the voltage supplying the integrated structure may need to be taken into account. For example, the isolating element 107 may include a trench having a length of about 1 $\mu$m, or a trench having a length equal to the length of the interface region 106.

It should be noted, for example, that the integrated structure according to FIGS. 1 and 2a–2c may be supplied with a voltage greater than 0 V and less than or equal to about 100 V and, preferably, between about 10 V and about 70 V. More preferably, this voltage may be between about 20 V and about 30 V.

With reference to FIGS. 3a–3d, a method for forming a particular integrated structure according to the invention such as the structure 100' including a bipolar transistor and a DMOS transistor will now be described. The elements similar to those described above will be indicated in the figures by similar reference numbers. In the description of this method of implementation, those steps which are known and obvious to a person skilled in the art will not be specifically described for clarity of explanation.

Figure 3A:
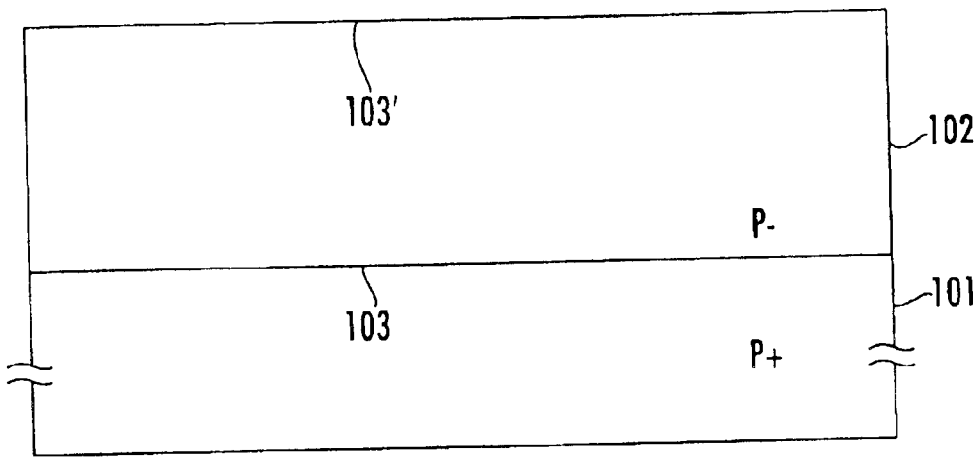
FIGS. 3a through 3d are cross-sectional views of an integrated structure according to FIG. 2c illustrating different stages in the manufacturing process.

An epitaxial layer 102 of the P– type is grown on the surface of the silicon substrate 101, of the P+ type, as shown in FIG. 3a. Then, a step involving formation of an isolating element similar to the isolating element 107 which surrounds the region 105 in FIG. 2c is performed. The step for creating this isolating element involves the formation of an isolating trench 201. The trench is formed by anisotropic etching of the epitaxial layer 102. A suitable etching method is, for example, dry etching.

Figure 3B:
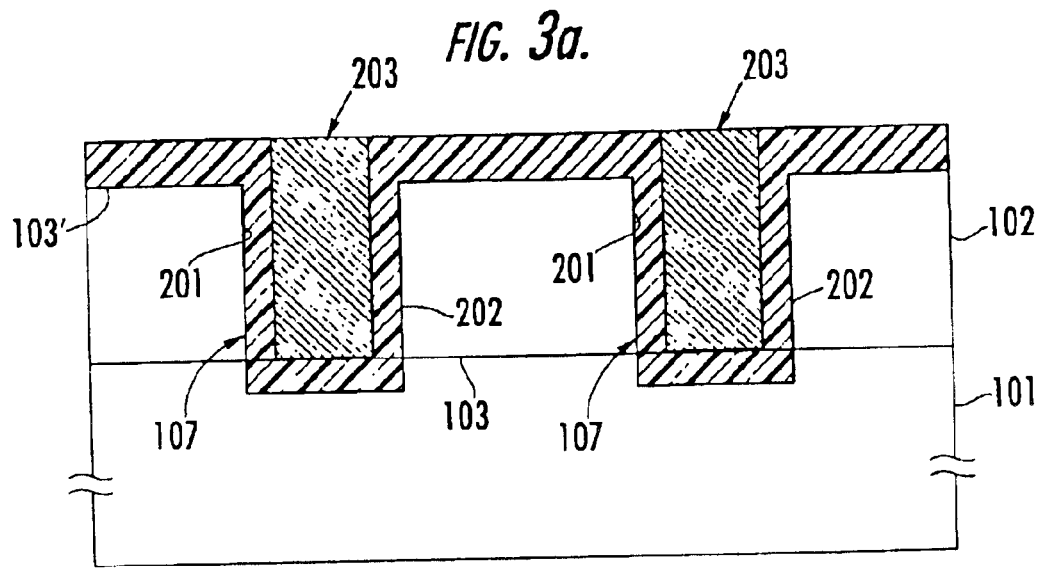

A cross-section through the integrated structure comprising the trench 201 is shown in FIG. 3b. The walls of the trench 201 and the upper surface of the epitaxial layer 102 are covered by a layer 202 of insulating material such as, for example, silicon dioxide ($SiO_2$). Following this, the trench 201 is filled with dielectric material such as, for example, polysilicon 203 to make the upper surface of the trench coplanar with the silicon dioxide layer 202 located on the upper surface of the epitaxial layer 102. This allows the process to be performed using methods known in the art.

Figure 3C:
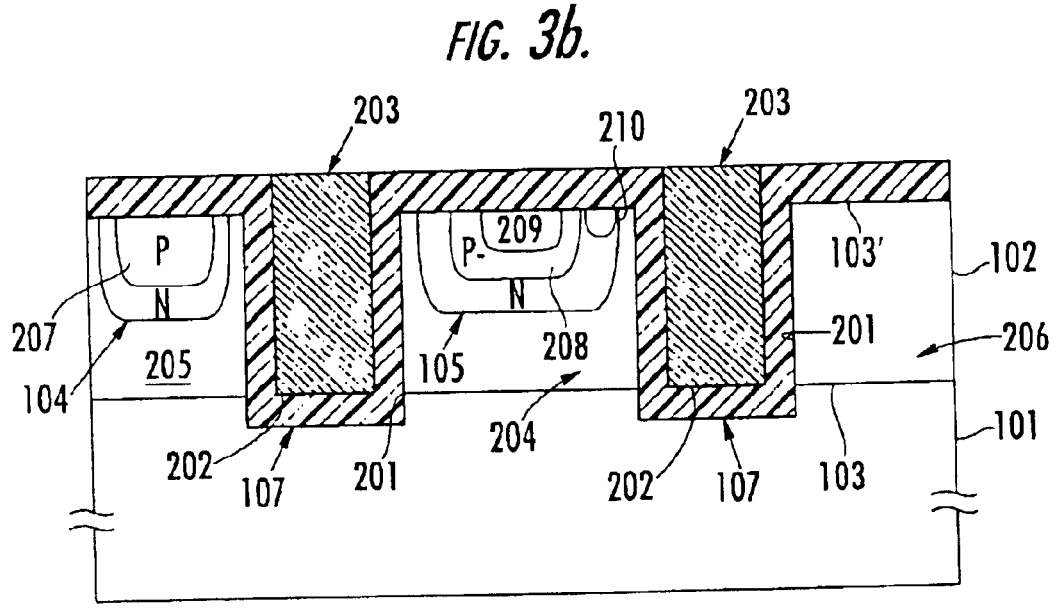

With reference to FIG. 3c, the isolating trench 201 defines internally a region 204 included within the epitaxial layer 102, and two regions 205, 206 located outside the trench. According to this particular embodiment of the invention, a bipolar transistor is created in the region 205, while a DMOS transistor is created in the region 204. Using known lithographic processes, two openings are created in the silicon dioxide layer 202, and diffusion of N– type impurities into the epitaxial layer 102 is performed through the openings. In this way, the two regions 104 and 105 are created.

A region 207 of the P type and a region 208 of the P+ type are created by diffusion inside these two regions 104 and 105, respectively. The regions 207, 104 and the assembly including the underlying epitaxial layer 102 and substrate 101 form, respectively, the emitter, base and collector regions of a vertical bipolar transistor.

Two regions 209 and 210 of the N+ type are created by diffusion inside the region 208 and the region 105. The region 209 and the region 208 are, respectively, the source region and body region of a DMOS transistor. The region 105 including the region 210, which is heavily doped, provides the collector (or drain) of this transistor. The region 210 prevents a PN junction from being formed between the region 105 and the metal terminal which is made, for example, of aluminum. The metal terminal will be placed in electrical contact with the region 105.

Figure 3D:
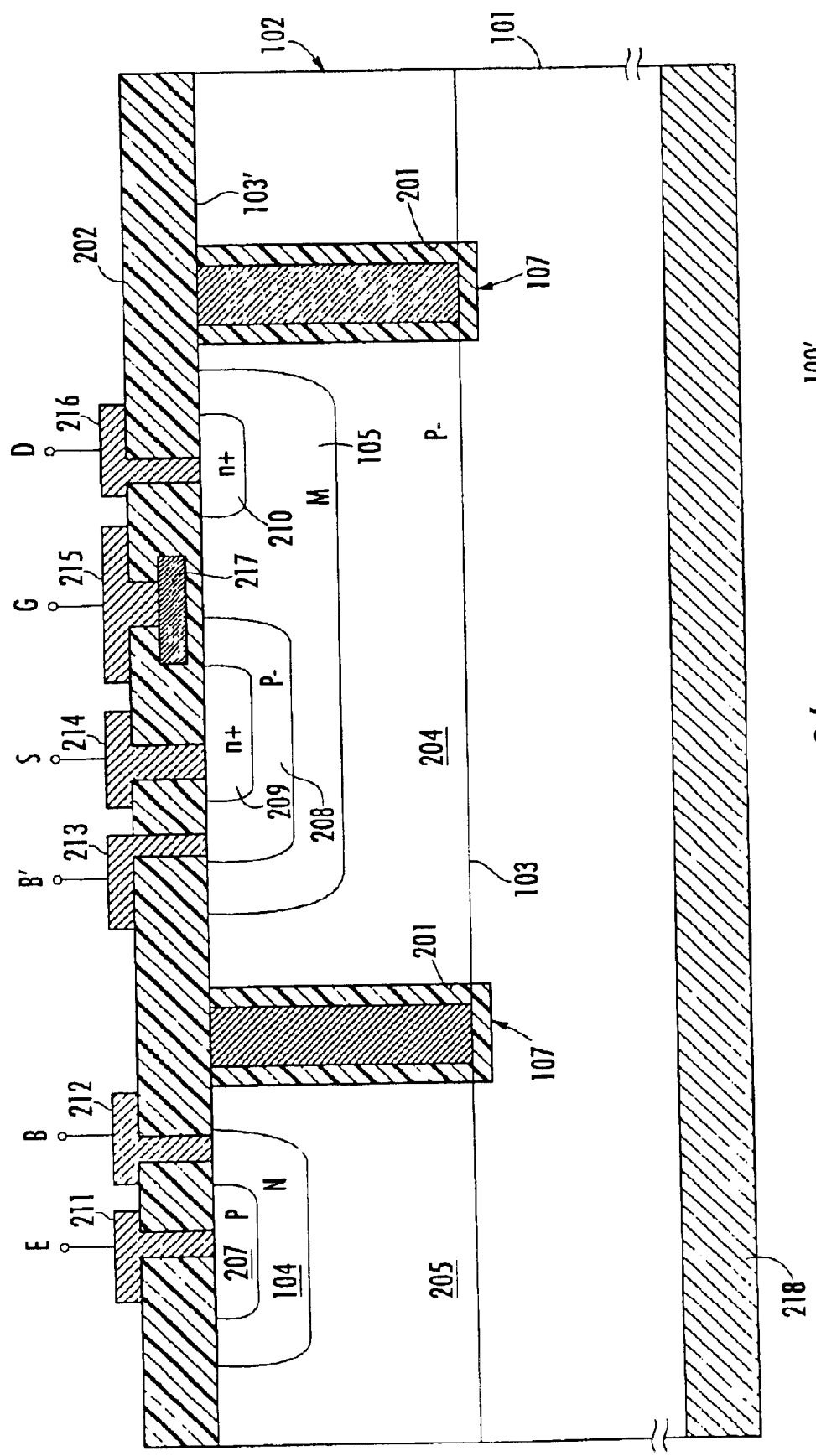

Turning now to FIG. 3d, the integrated structure 100' is shown with the metal electrodes of the emitter E 211 and the base B 212 of the bipolar transistor and with the metal electrodes of the body B' 213, source S 214, gate G 215 and drain D 216 of the DMOS transistor. The gate electrode G 215 includes a polysilicon element 217 deposited, for example, using chemical vapor deposition (CVD) techniques. The gate electrode 217 is separated from the upper surface of the epitaxial layer 102 by a thin insulating layer.

Moreover, during a final step, a metal layer 218 (e.g., aluminum) is formed, which is arranged on the bottom surface of the substrate 101. This metal layer 218 acts as a collector electrode for the PNP bipolar transistor of the region 205. The bipolar transistor formed in the region 205 may, for example, be a transistor for an analog (signal processing) part, while the DMOS transistor may be used as a power transistor suitable for supplying an inductive load (not shown) connected to its drain electrode D 216. This drain electrode may otherwise be placed in bias conditions which could result in the formation of an NPN parasitic transistor (including the region 104, the epitaxial layer 102, and the region 105) if the isolating element 107 were not present.

Moreover, a DMOS transistor may also be formed in the region 104, for example, as in DMOS bridge structures designed to supply inductive loads. Circuit components other than those described, such as, integrated resistors, MOS transistors, or NPN transistors, for example, may be associated with the region 104 and the region 105. It will be appreciated by those of skill in the art that the formation of the isolating element does not significantly complicate the method for construction of the integrated structure.

Alternatively, the step of forming the isolating element may be performed following the steps of creating the differently doped regions corresponding to the circuit components integrated in the single chip. In this case, the oxide layer present on the surface of the chip at the end of diffusion of the variously doped regions corresponding to the integrated components will be removed. This allows access to the epitaxial layer in which the trench will be formed.

It should be noted that the step of etching the epitaxial layer may be advantageously performed at temperatures which are sufficiently low not to substantially alter the configuration of the previously doped regions. However, formation of the isolating element before creation of the integrated devices is preferred because it avoids removal of the isolating layer.

Those of skill in the art, for the purpose of satisfying specific requirements, may make numerous modifications and variations to the integrated structure and to the production method described above, all of which, however, are included within the scope of production of the invention, as defined in the following claims.

That which is claimed is:

1. A Bipolar-CMOS-DMOS (BCD) integrated circuit comprising:
    a substrate having a first conductivity type;
    an epitaxial layer on said substrate and having the first conductivity type and a conductivity less than a conductivity of said substrate;
    first and second regions in said epitaxial layer each having a second conductivity type opposite the first conductivity type, said first and second regions extending from a surface of said epitaxial layer opposite said substrate into said epitaxial layer to form respective first and second normally reverse-biased junctions therewith;
    the first region defining a power section integrated in said epitaxial layer, and the second region defining a signal processing section integrated in said epitaxial layer, at least one of said power section and said signal processing section including at least one of a bipolar transistor and a DMOS transistor;
    first and second electrodes for independently biasing the first and second junctions, respectively; and
    an isolating element positioned between said first and said second regions and extending from the surface of said epitaxial layer at least as far as a top surface of said substrate for reducing an injection of current through said epitaxial layer from said first region to said second region when the first junction is biased to cause the injection of current, said isolating element comprising a dielectric material adjacent said epitaxial layer and polycrystalline silicon spaced apart from said epitaxial layer by said dielectric material, said isolating element also surrounding said first region on all lateral sides terminating above a bottom surface of said substrate.

2. The Bipolar-CMOS-DMOS (BCD) integrated circuit according to claim 1 wherein the first conductivity type is P type.

3. The Bipolar-CMOS-DMOS (BCD) integrated circuit according to claim 1 wherein said power section comprises a power transistor for controlling an inductive load.

4. A Bipolar-CMOS-DMOS (BCD) integrated circuit comprising:
    a substrate having a first conductivity type;
    an epitaxial layer on said substrate and having the first conductivity type and a conductivity less than a conductivity of said substrate;
    first and second regions in said epitaxial layer each having a second conductivity type opposite the first conductivity type, said first and second regions extending from a surface of said epitaxial layer opposite said substrate into said epitaxial layer to form respective first and second normally reverse-biased junctions therewith;
    the first region defining a power section integrated in said epitaxial layer, and the second region defining a signal processing section integrated in said epitaxial layer, at least one of said power section and said signal processing section including at least one of a bipolar transistor and a DMOS transistor;
    first and second electrodes for independently biasing the first and second junctions, respectively; and
    an isolating element positioned between said first and said second regions and extending from the surface of said epitaxial layer at least as far as a top surface of said substrate for reducing an injection of current through said epitaxial layer from said first region to said second region when the first junction is biased to cause the injection of current, said isolating element surrounding at least one of said first and second regions on all lateral sides, said isolating element also terminating above a bottom surface of said substrate.

5. The Bipolar-CMOS-DMOS (BCD) integrated circuit according to claim 4 wherein said isolating element comprises a dielectric material.

6. The Bipolar-CMOS-DMOS (BCD) integrated circuit according to claim 5 wherein said isolating element further comprises polycrystalline silicon.

7. The Bipolar-CMOS-DMOS (BCD) integrated circuit according to claim 4 wherein the first conductivity type is P type.

8. The Bipolar-CMOS-DMOS (BCD) integrated circuit according to claim 4 wherein said power section comprises a power transistor for controlling an inductive load.

* * * * *